US009991231B2

(12) United States Patent
Woychik et al.

(10) Patent No.: US 9,991,231 B2
(45) Date of Patent: Jun. 5, 2018

(54) STACKED DIE INTEGRATED CIRCUIT

(71) Applicant: Invensas Corporation, San Jose, CA (US)

(72) Inventors: Charles G. Woychik, Niskayuna, NY (US); Cyprian Emeka Uzoh, San Jose, CA (US); Ron Zhang, Sunnyvale, CA (US); Daniel Buckminster, Amherst, MA (US); Guilian Gao, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days. days.

(21) Appl. No.: 15/234,425

(22) Filed: Aug. 11, 2016

(65) Prior Publication Data
US 2017/0033088 A1  Feb. 2, 2017

Related U.S. Application Data

(62) Division of application No. 14/220,912, filed on Mar. 20, 2014, now Pat. No. 9,418,924.

(51) Int. Cl.
*H01L 21/48* (2006.01)
*H01L 25/065* (2006.01)
(Continued)

(52) U.S. Cl.
CPC ........ *H01L 25/0657* (2013.01); *H01L 21/304* (2013.01); *H01L 21/486* (2013.01); *H01L 21/4853* (2013.01); *H01L 21/52* (2013.01); *H01L 21/565* (2013.01); *H01L 21/76898* (2013.01); *H01L 21/78* (2013.01); *H01L 23/3114* (2013.01); *H01L 23/481* (2013.01); *H01L 23/49827* (2013.01); *H01L 23/49838* (2013.01); *H01L 23/49894* (2013.01); *H01L 24/85* (2013.01); *H01L 24/94* (2013.01); *H01L 24/97* (2013.01); *H01L 25/0652* (2013.01); *H01L 25/0655* (2013.01); *H01L 25/50* (2013.01); *H01L 23/13* (2013.01); *H01L 24/13* (2013.01); *H01L 24/16* (2013.01);
(Continued)

(58) Field of Classification Search
None
See application file for complete search history.

(56) References Cited

U.S. PATENT DOCUMENTS 8,952,533 B2   2/2015  Mohammed et al.
9,396,883 B2   7/2016  Pande et al.
(Continued)

OTHER PUBLICATIONS

International Search Report and Written Opinion dated Jun. 2, 2015, Intl. Application No. PCT/US2015/021224, filed Mar. 18, 2015.

*Primary Examiner* — Daniel Whalen

(57) ABSTRACT

An apparatus relates generally to an integrated circuit package. In such an apparatus, a package substrate has a first plurality of via structures extending from a lower surface of the package substrate to an upper surface of the package substrate. An die has a second plurality of via structures extending to a lower surface of the die. The lower surface of the die faces the upper surface of the package substrate in the integrated circuit package. The package substrate does not include a redistribution layer. The die and the package substrate are coupled to one another.

14 Claims, 13 Drawing Sheets

(51) Int. Cl.
　　*H01L 21/52*　　(2006.01)
　　*H01L 21/78*　　(2006.01)
　　*H01L 23/48*　　(2006.01)
　　*H01L 23/498*　　(2006.01)
　　*H01L 23/00*　　(2006.01)
　　*H01L 21/768*　　(2006.01)
　　*H01L 21/304*　　(2006.01)
　　*H01L 21/56*　　(2006.01)
　　*H01L 23/31*　　(2006.01)
　　*H01L 25/00*　　(2006.01)
　　*H01L 23/13*　　(2006.01)

(52) U.S. Cl.
　　CPC .............. *H01L 24/17* (2013.01); *H01L 24/32* (2013.01); *H01L 24/73* (2013.01); *H01L 24/92* (2013.01); *H01L 2224/131* (2013.01); *H01L 2224/13025* (2013.01); *H01L 2224/13147* (2013.01); *H01L 2224/16145* (2013.01); *H01L 2224/16146* (2013.01); *H01L 2224/16225* (2013.01); *H01L 2224/16235* (2013.01); *H01L 2224/16238* (2013.01); *H01L 2224/1703* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/92125* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06544* (2013.01); *H01L 2225/06548* (2013.01); *H01L 2225/06555* (2013.01); *H01L 2225/06582* (2013.01); *H01L 2225/06589* (2013.01); *H01L 2924/00014* (2013.01); *H01L 2924/15159* (2013.01); *H01L 2924/15192* (2013.01); *H01L 2924/15311* (2013.01); *H01L 2924/16152* (2013.01); *H01L 2924/16235* (2013.01); *H01L 2924/16251* (2013.01); *H01L 2924/181* (2013.01); *H01L 2924/18161* (2013.01); *H01L 2924/3511* (2013.01)

(56) References Cited

U.S. PATENT DOCUMENTS

| | | | |
|---|---|---|---|
| 2008/0285244 A1* | 11/2008 | Knickerbocker | G01R 1/0425 361/760 |
| 2011/0058348 A1* | 3/2011 | Sakai | H01L 23/481 361/803 |
| 2012/0187545 A1* | 7/2012 | Khan | H01L 21/561 257/621 |
| 2012/0273782 A1 | 11/2012 | Goel et al. | |
| 2014/0036454 A1 | 2/2014 | Caskey et al. | |
| 2014/0070406 A1 | 3/2014 | Mohammed et al. | |
| 2014/0070423 A1* | 3/2014 | Woychik | H01L 23/562 257/774 |
| 2014/0321093 A1 | 10/2014 | Pande et al. | |

* cited by examiner ic # STACKED DIE INTEGRATED CIRCUIT

CROSS-REFERENCE TO RELATED APPLICATION

This application is a divisional of and claims benefit of priority to U.S. patent application Ser. No. 14/220,912, filed Mar. 20, 2014, the disclosure of which is incorporated herein by reference in its entirety.

FIELD

The following description relates to integrated circuits ("ICs"). More particularly, the following description relates to a stacked die IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), a printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventional interconnecting of an IC to another IC or to a circuit platform has issues with density or pitch of input/output interconnects ("I/Os"), and so dies have been stacked to form "3D ICs" to enhance numbers of I/Os. However, there are issues associated with forming such "3D ICs", including without limitation cost.

Accordingly, it would be desirable and useful to provide lower cost "3D ICs".

BRIEF SUMMARY

An apparatus relates generally to an integrated circuit package. In such an apparatus, a package substrate has a first plurality of via structures extending from a lower surface of the package substrate to an upper surface of the package substrate. A die has a second plurality of via structures extending to a lower surface of the die. The lower surface of the die faces the upper surface of the package substrate in the integrated circuit package. The package substrate does not include a redistribution layer. The die and the package substrate are coupled to one another.

A method relates generally to an integrated circuit package. In such a method, obtained is a package substrate having a first plurality of via structures extending from a lower surface of the package substrate to an upper surface of the package substrate. A die having a second plurality of via structures extending to a lower surface of the die is obtained. The lower surface of the die is positioned for facing the upper surface of the package substrate to provide the integrated circuit package. The die and the package substrate are coupled to one another. The package substrate does not include a redistribution layer.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

Figure 3A:
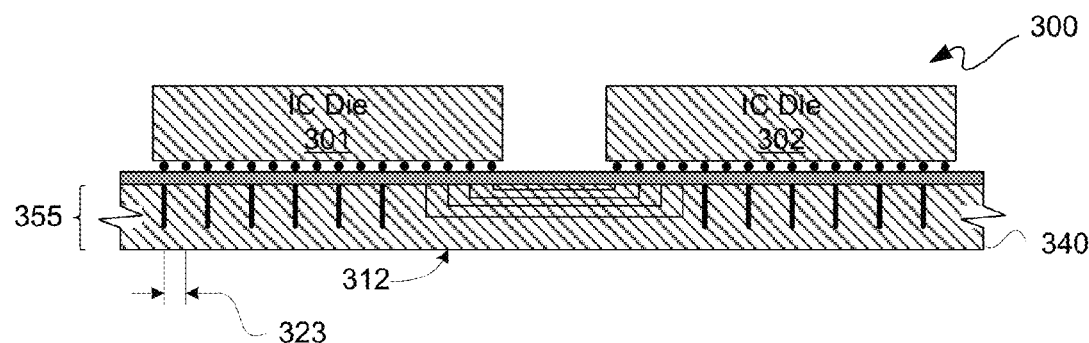
FIGS. 3A through 3D are respective block diagrams of a cross sectional view depicting an exemplary flow for in-process a 3D IC packaged component ("IC package") for a process of manufacturing thereof.
Figure 3B:
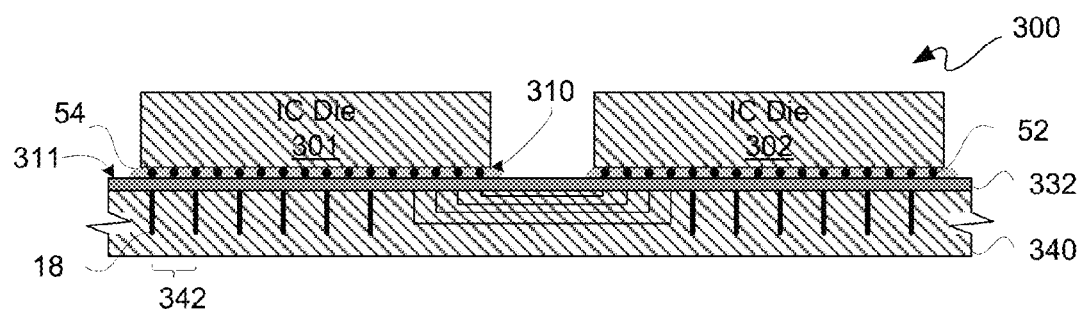
Figure 3C:
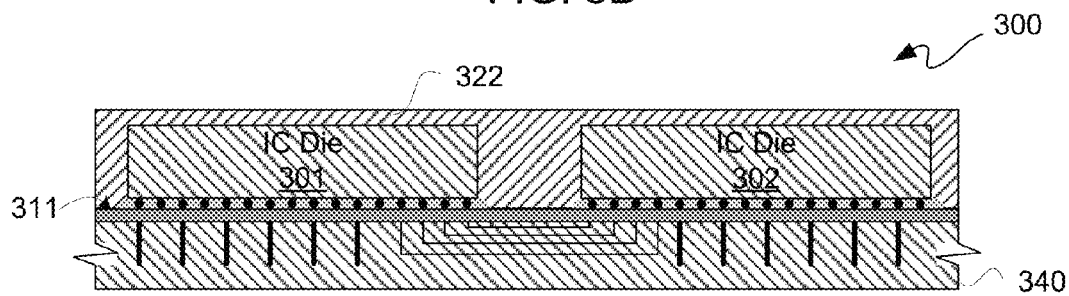
Figure 3D:
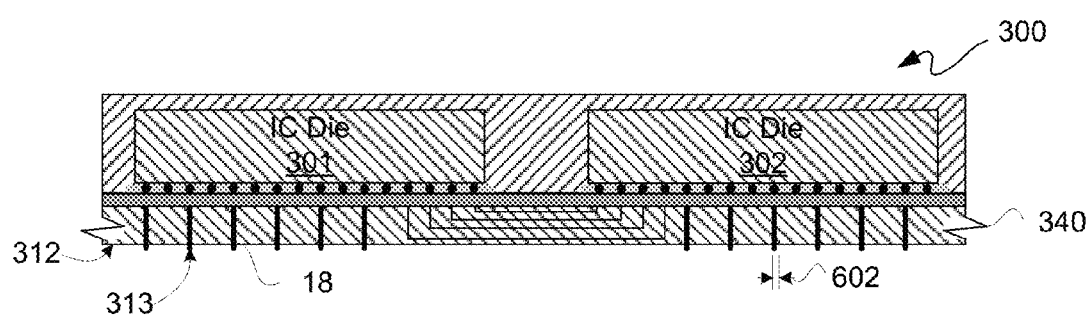
Figure 4A:
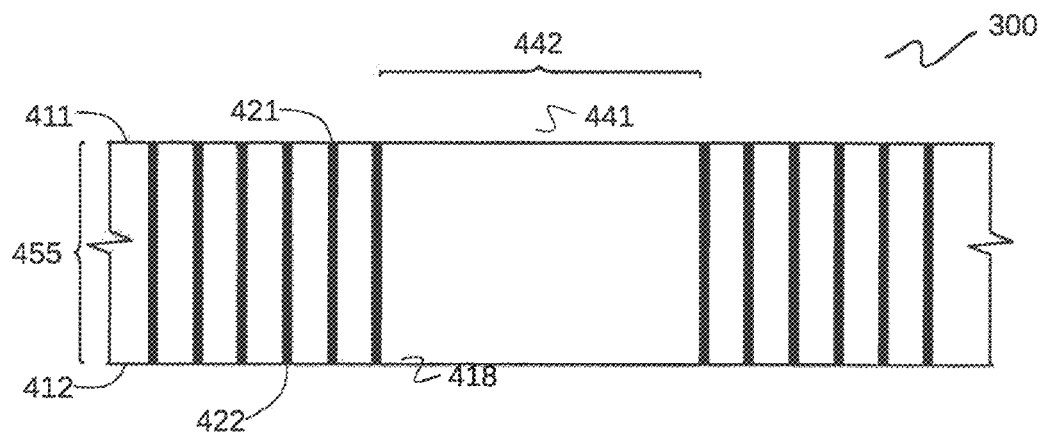
FIGS. 4A through 4C are respective block diagrams of a cross sectional view depicting an exemplary flow for a package substrate for an IC package for a process of manufacturing thereof.
Figure 4B:
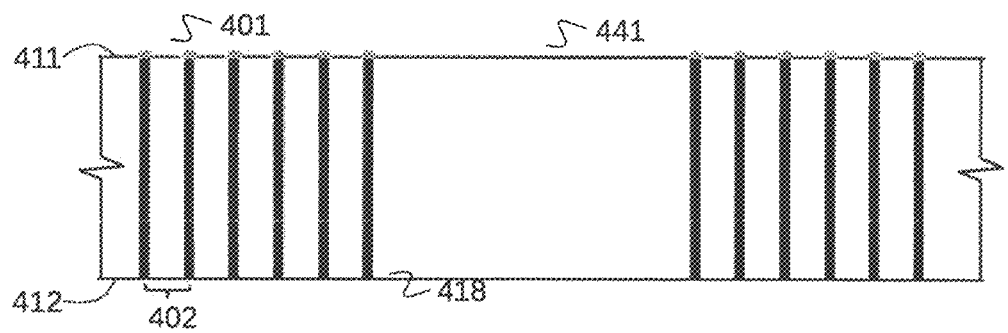
Figure 5A:
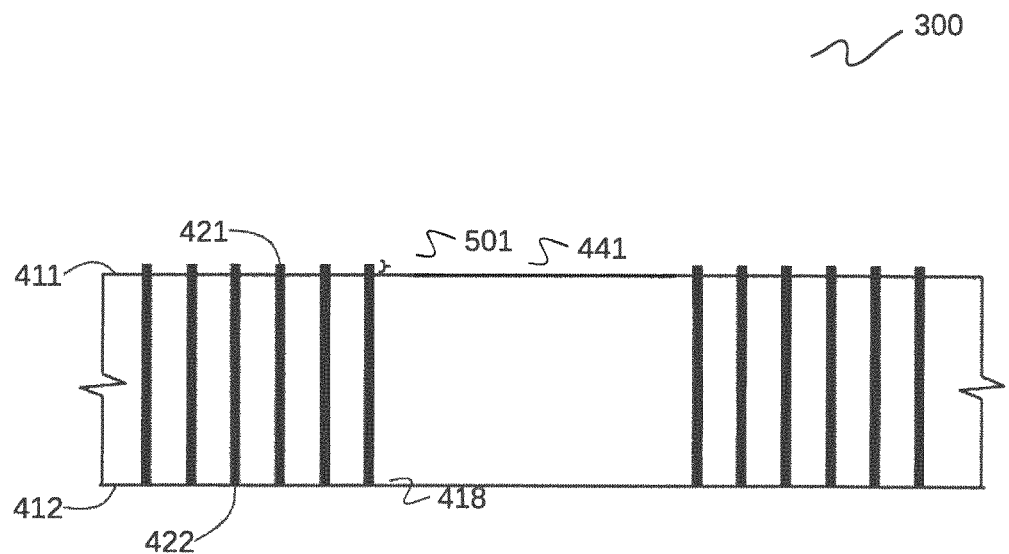
FIGS. 5A and 5B are respective block diagrams of a cross sectional view depicting another exemplary package substrate for an IC package for a process of manufacturing thereof.
Figure 5B:
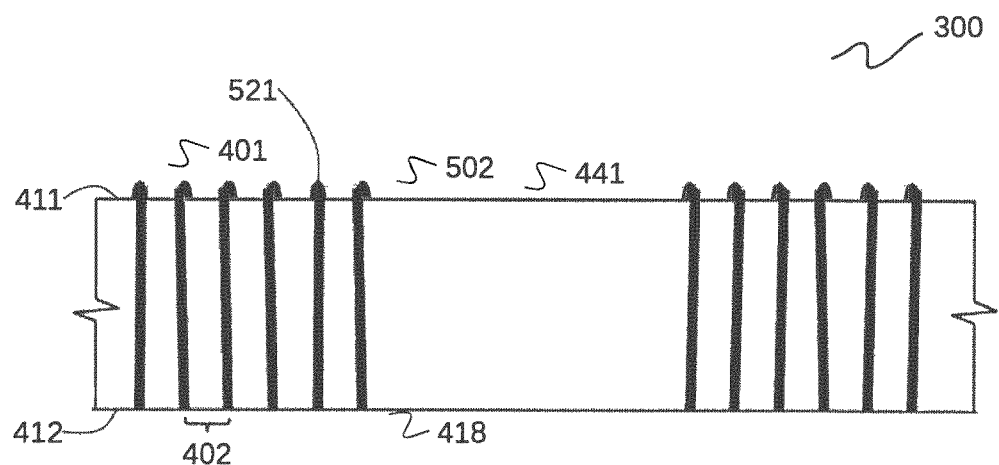

FIGS. 6A-1, 6A-2, 6B, 6C, 6D-1, 6D-2, 6E, 6F-1, 6F-2, and 6G are block diagrams depicting respective cross sectional views for exemplary flows for processes of manufacturing an IC package after interconnection of the interposer of FIG. 3D with package substrate of FIGS. 4B and 5B, respectively.

Figures 1, 6A:
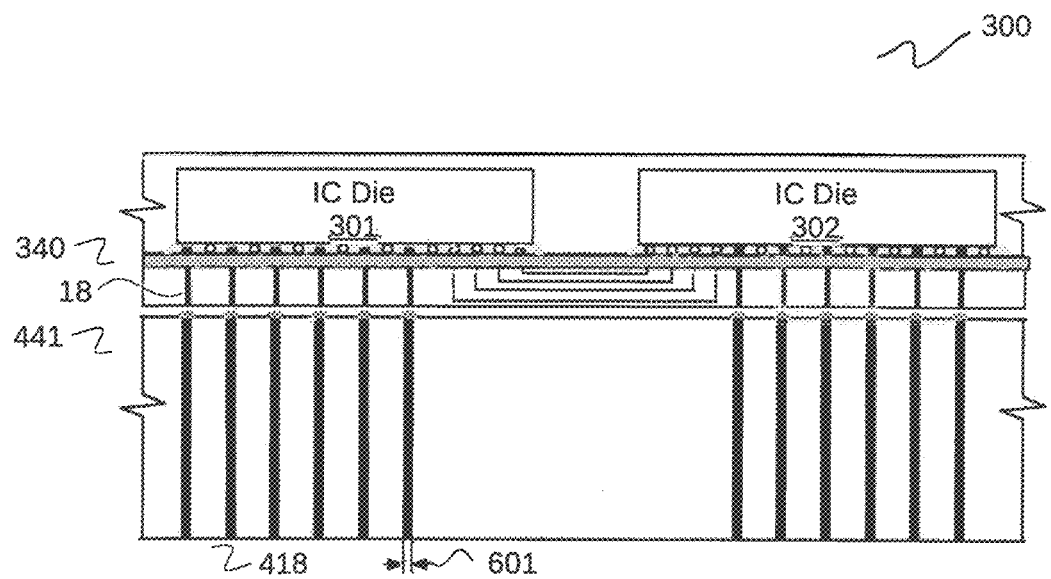
Figures 2, 6A:
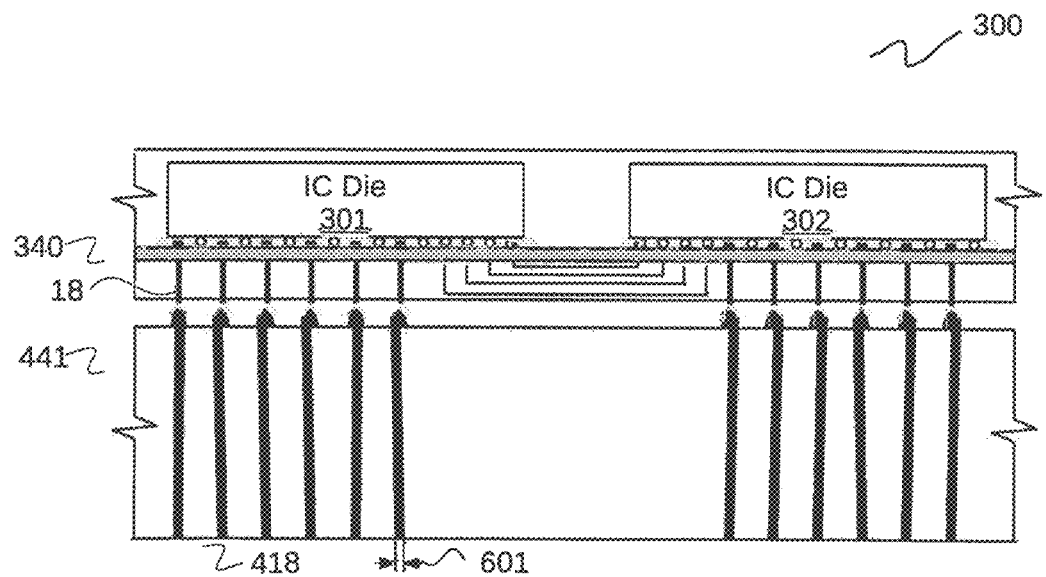
Figure 6B:
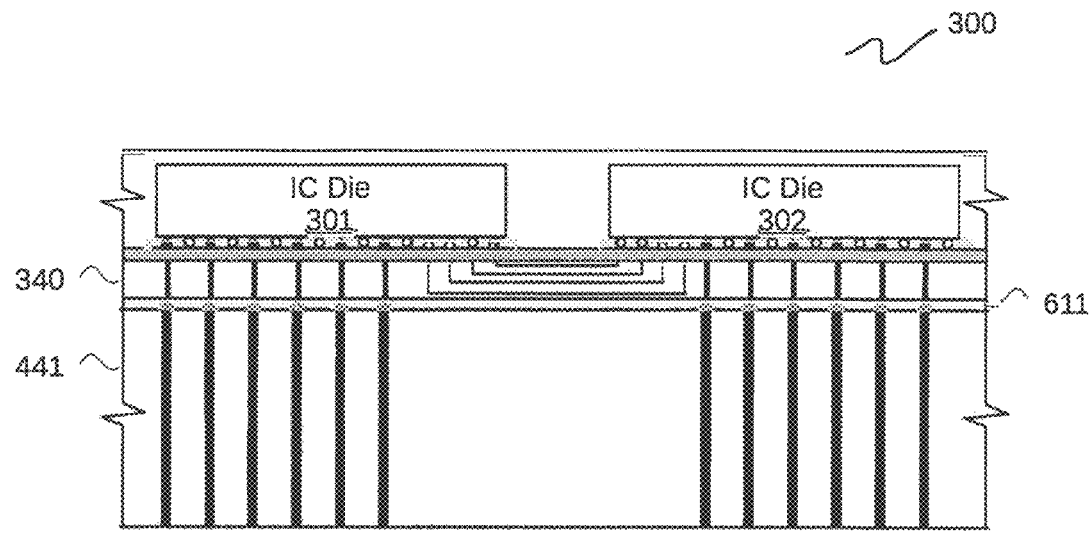
Figure 6C:
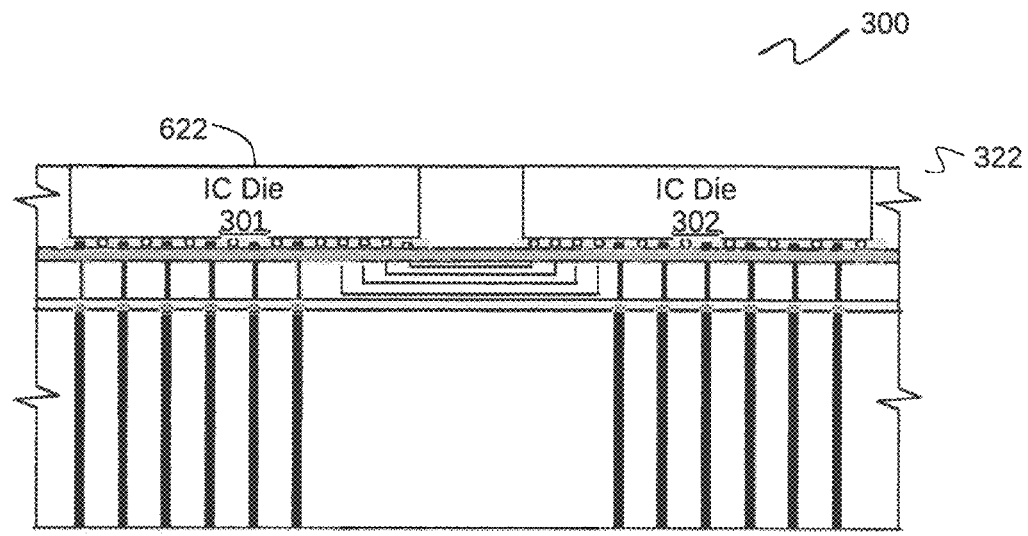
Figures 1, 6D:
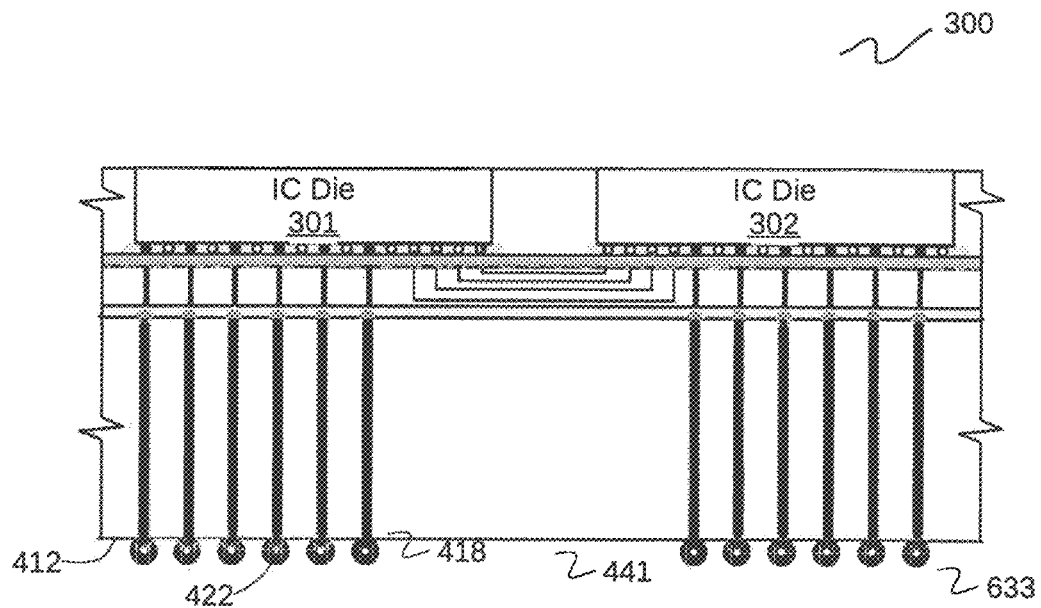
Figures 2, 6D:
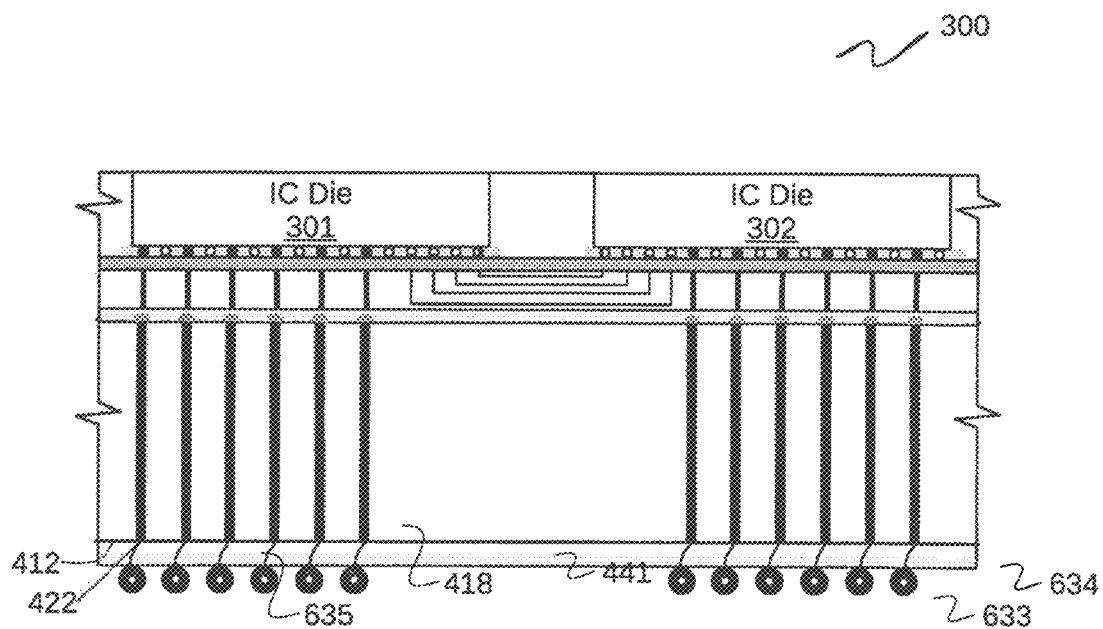
Figure 6E:
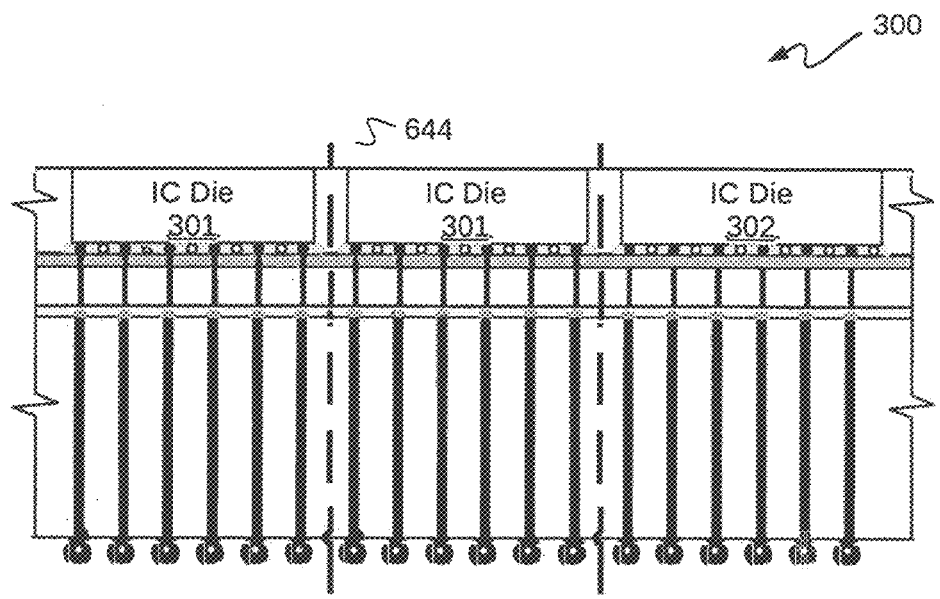
Figures 1, 6F:
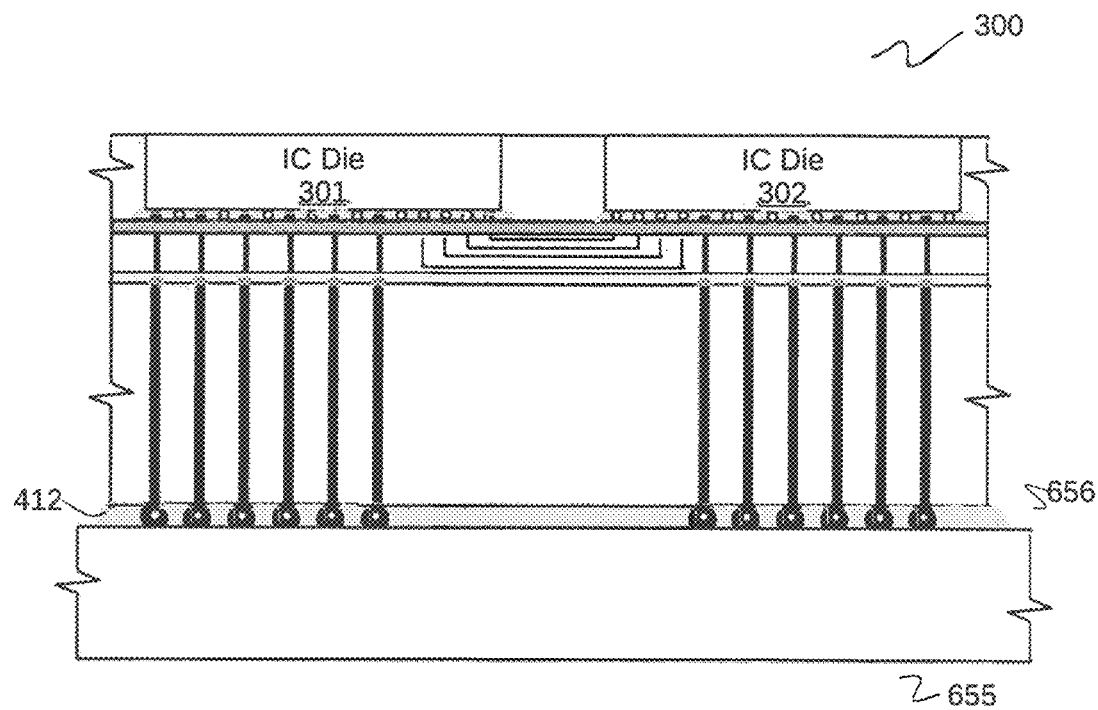
Figures 2, 6F:
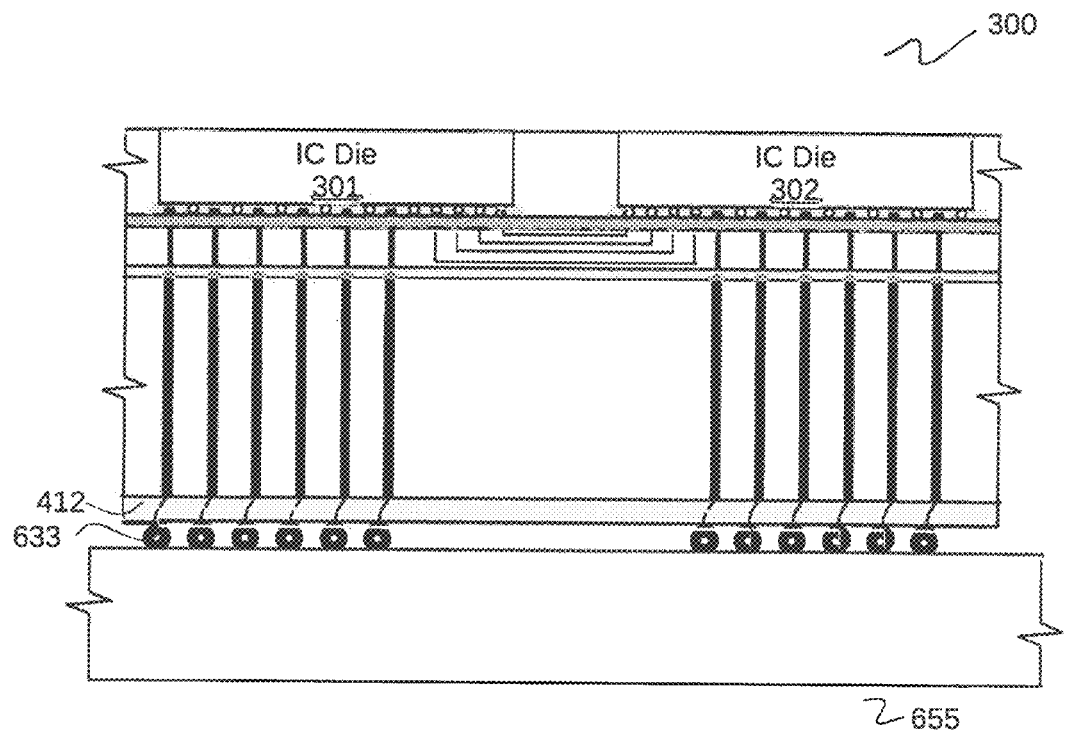
Figure 7:
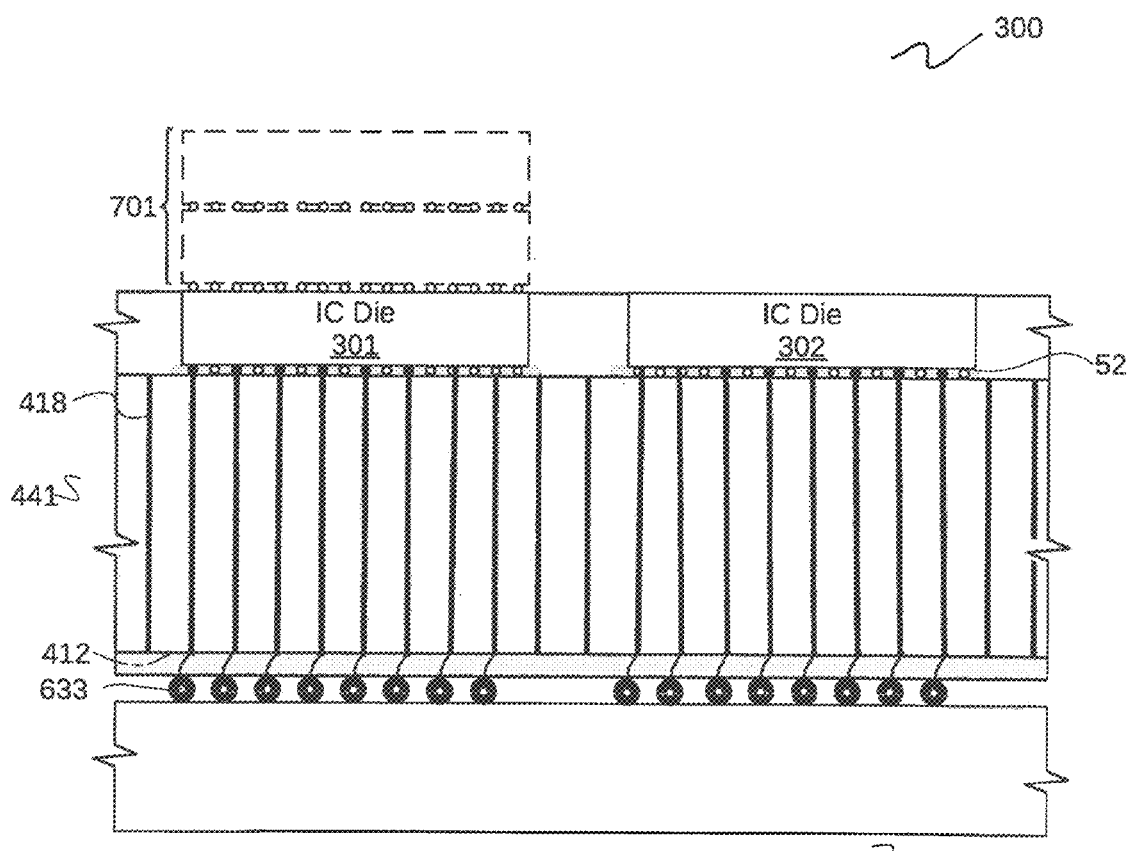

FIG. 7 is generally the block diagram of FIG. 6F-2 without an interposer.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
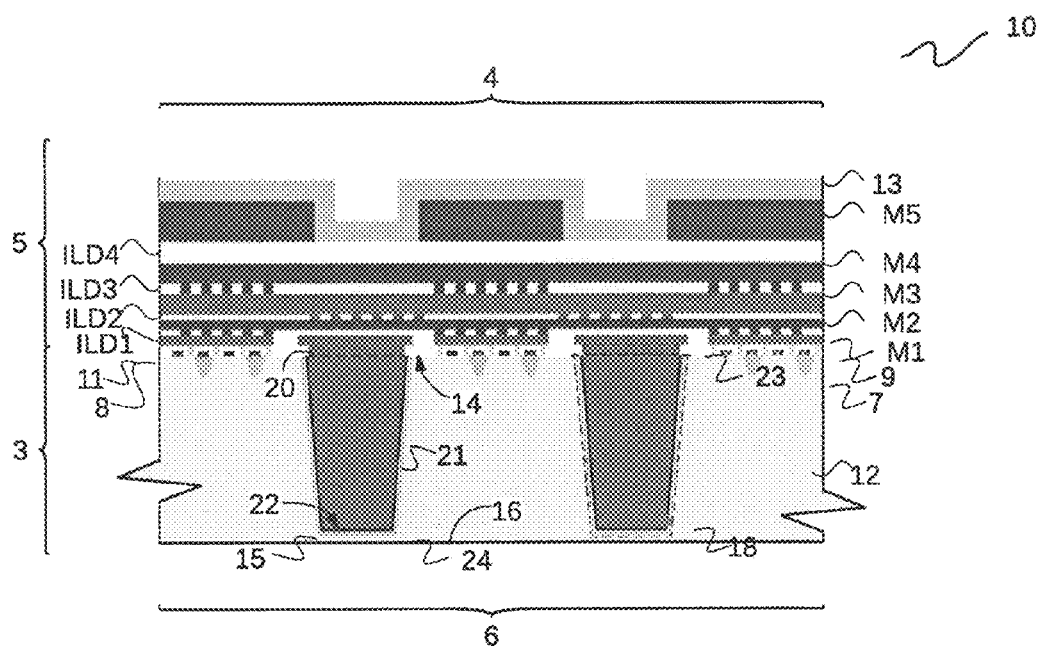
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening or hole formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011, and U.S. patent application Ser. Nos. 12/842,717 and 12/842,651 both filed on Jul. 23, 2010, and each of these patent applications is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of Ni, compounds of Cu, among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
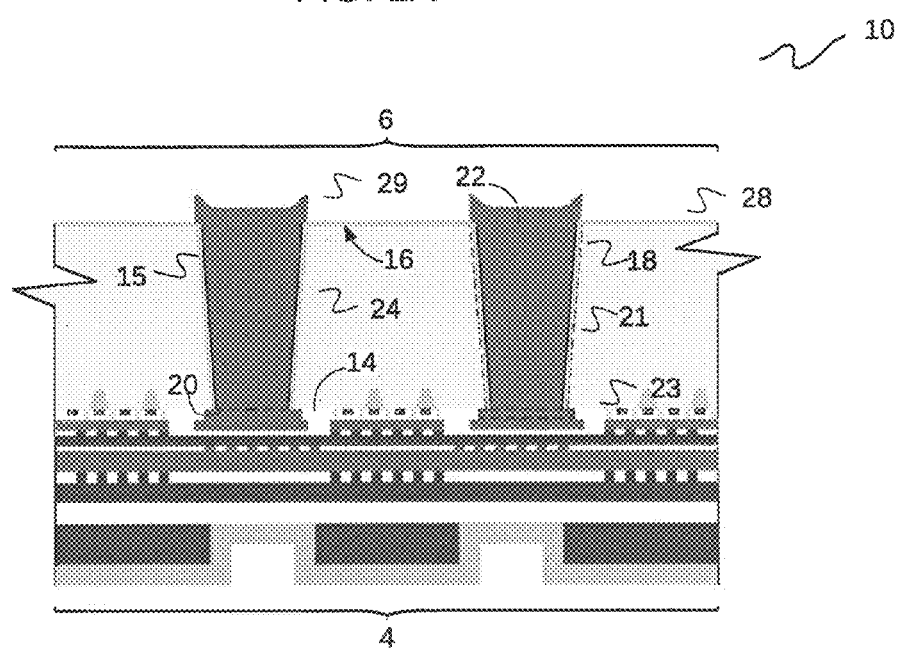
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach."

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
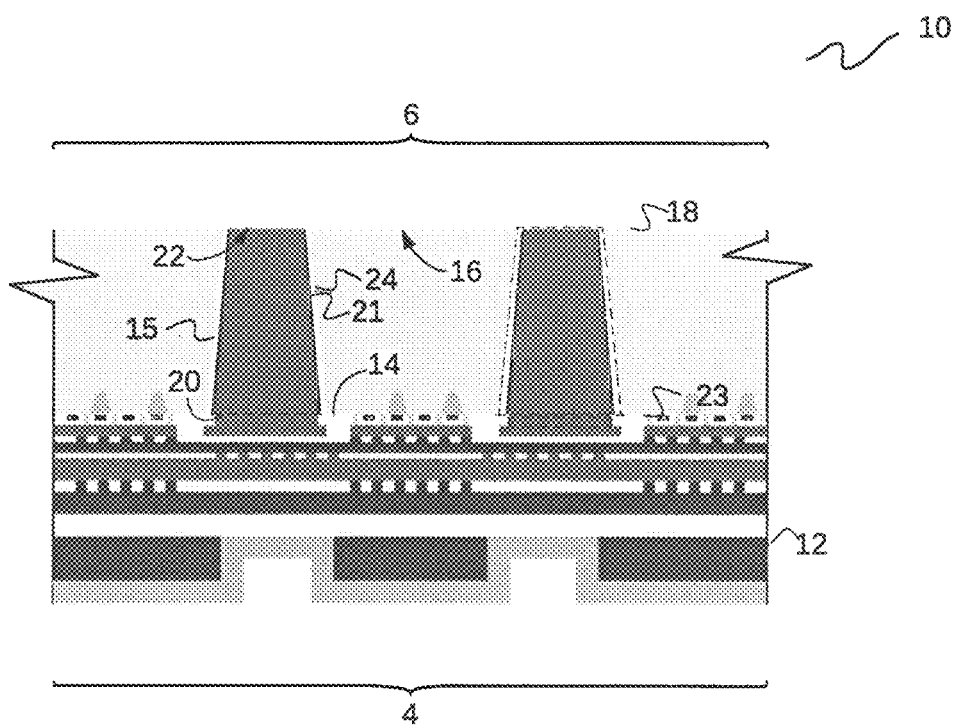
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
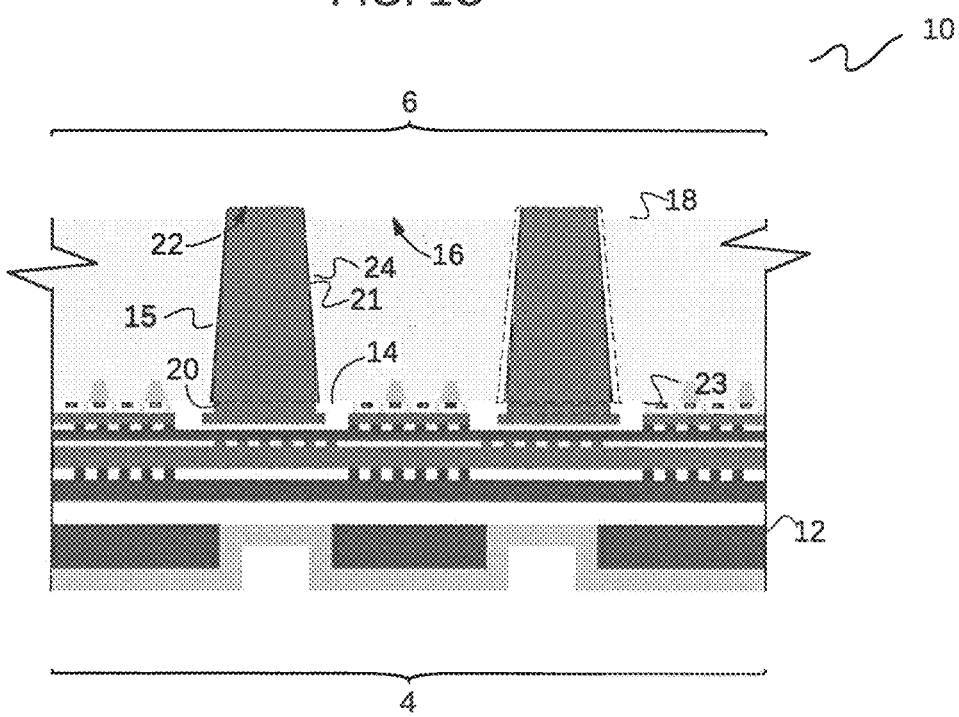
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
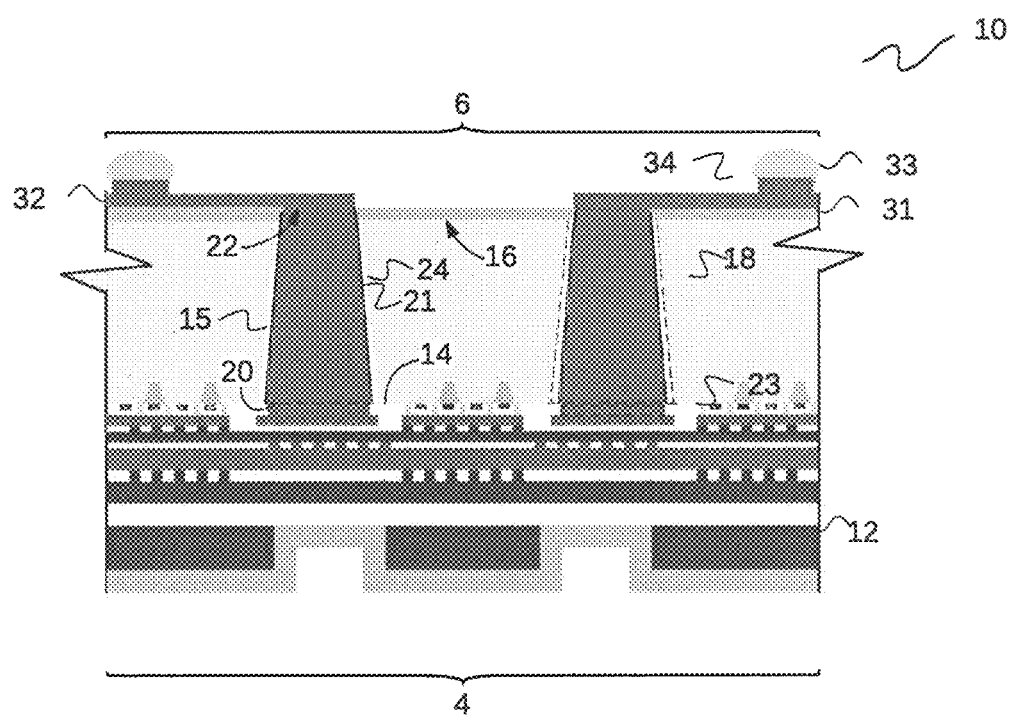
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
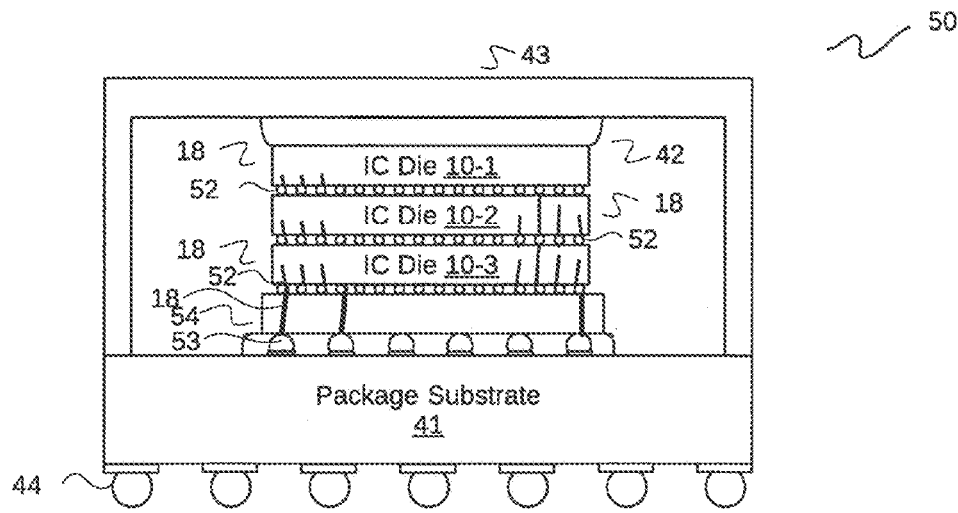
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate 41. A package substrate 41 may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An underfill 54 for a flip chip attachment may encapsulate C4 bumps or other solder balls 53 used to couple interposer die 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42 may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

Figure 2B:
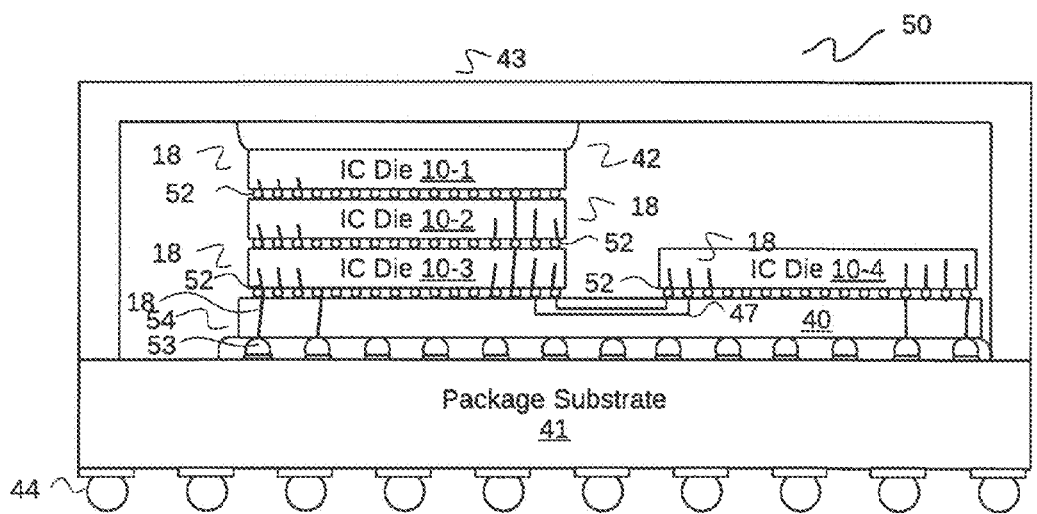
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

FIGS. 3A through 3D are respective block diagrams of a cross sectional view depicting an exemplary flow for an in-process 3D IC packaged component ("IC package") 300 for a process of manufacturing thereof. IC package 300 includes a plurality of IC dies, such as for example IC dies 301 and 302, and an interposer 340 coupled to such IC dies with a plurality of interconnects, such as microbumps or flip chip solder bumps ("bumps") 52 for example. Bumps 52 may have a pitch 323, which is substantially smaller than pitch 342. At FIG. 3B, an underfill 54 may be deposited so as to be disposed between lower surfaces 310 of IC dies 301 and 302 and a upper surface 311 of an RDL 332 of interposer 340, namely an upper surface of interposer 340. Even though an underfill 54 is illustratively depicted, a molding material, an encapsulation material, and/or an underfill material may be used to provide lateral support between dies 301 and 302 and interposer 340 for subsequent processing. RDL 332 may be coupled to via structures 18 of interposer 340. Interposer 340 may thus have a single RDL 332, and such RDL 332 may be disposed on an opposite side from a package substrate attached thereto, namely such single RDL 332 may be disposed on a side of interposer 340 that is for attachment of one or more IC die to such side. Along those lines, interposer 340 does not have an RDL disposed on an opposing side with respect to a package substrate attached thereto, namely there is no RDL along lower surface 312 of interposer 340. Thus, via structures of a package substrate may be coupled to via structures 18 of interposer 340 for a one-to-one correspondence without passage of any signals, including without limitation power and ground, through an RDL for such coupling. Such a package substrate may be for one or more dies of a system-in-a-package ("SiP") or an interposer, namely generally for one or more dies used for or in D2D, W2D, or WLP interconnections for forming a 3D IC.

Interposer 340 may have an overall thickness 355 of 0.05 millimeters (mm; 50 microns) or less. For purposes of clarity by way of example and not limitation, it shall be assumed that interposer 340, as well as IC dies 301 and 302, includes a fabricated multi-layered structure ("substrate") with generally any and all BEOL and FEOL processing operations having been completed generally for providing an IC package 300. In passive die configurations, such as a passive interposer for example, there may not be any FEOL processing operations. As used above, a substrate 12 of FIG. 1A for example was a single layer. However, more generally a substrate may be a single layer or multiple layers used to form a passive or active component. Along those lines, a semiconductor die may be referred to as a substrate.

Again, for purposes of clarity by way of example and not limitation, it shall be assumed that a BEOL layer or an RDL 332 has been formed on interposer 340 as part of in-process IC package 300. As shall be understood more particularly from the following description, one or more RDLs previously in a package substrate have effectively been moved to RDL 332. Thus, RDL 332 may include additional routing of power, ground, and/or off-package input and output signaling. Along those lines, pitch 342 of conductive via structures 18 may be equal to pitch of corresponding via structures in a package substrate, such as of IC package 300.

At FIG. 3C, a molding or encapsulant material or compound ("molding") 322 may be deposited over IC dies 301 and 302 and onto upper surface 311 for sealing IC dies 301 and 302 to interposer 340. At FIG. 3D, a backside reveal may be performed on a lower surface 312 of interposer 340. Such backside reveal may be used to expose lower portions 313 of via structures 18. Via structures 18 have a thickness 602.

Figure 4C:
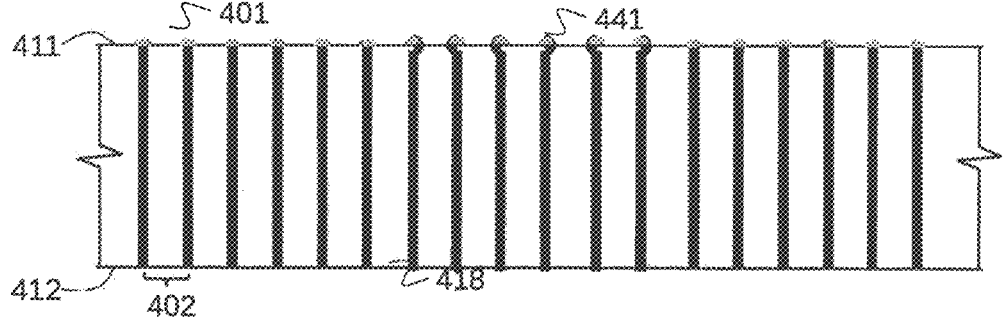

FIGS. 4A through 4C are respective block diagrams of a cross sectional view depicting an exemplary flow for a package substrate 441 for an IC package 300 for a process of manufacturing thereof. Package substrate 441 may have a plurality of conductive via structures 418 extending from a lower surface 412 of package substrate 441 to an upper surface 411 of package substrate 441. Package substrate 441 may optionally have a section, such as middle section 442, where there are no conductive via structures 418. Package substrate 441 may have an overall thickness 455 of approximately a 0.1 to 0.5 mm, namely 100 to 500 microns, which may be an integer multiple of thickness 355 of interposer 340. Exposed ends 421 of via structures 418 along upper surface 411 may be for interconnecting to an interposer 340. Exposed ends 422 of via structures 418 along lower surface 412 may be for interconnecting to a printed circuit board or backplane or other circuit board, including without limitation flexible printed circuits or high-density PCBs. The material can be FR4, FR5, BT, ceramic, build-up, polyimide, or any other board material. Package substrate 441 may be formed of a semiconductor, such as silicon. However, package substrate 441 may be formed of any of a variety of other substrate materials, and thus is not limited to being formed of a semiconductor. For example, package substrate 441 may be formed of an inorganic or organic material. Some examples of other substrate materials that may be used to provide package substrate 441 include ceramics, glasses, composites, and polymers, or a combination thereof, such as polymer composites for example. Generally, a package substrate material may have a coefficient of thermal expansion ("CTE") in a range of approximately 2 to 7 parts-per million per degree Celsius (ppm/° Celsius), and/or a modulus of a package substrate material may be in a range of approximately 70 to 140 gigapascals (GPa). Because thickness of package substrate 441 may be sufficiently large to mitigate against significant warpage, modulus and/or CTE values may vary from application-to-application.

At FIG. 4B, solder bumps 401, such as for a plurality of interconnects respectively, may be deposited for attachment to conductive via structures 418. Such solder bumps 401 may be deposited along upper surface 411 of package substrate 441 corresponding to exposed ends 421 of via structures 418. Via structures may have a pitch 402 which is equivalent to or at least sufficiently close to pitch 342, such that there is a one-to-one correspondence between via structures 418 of package substrate 441 and via structures 18 of interposer 340.

FIG. 4C is an alternative implementation, where conductive via structures 418 are disposed throughout package substrate 441, including middle section 442. Along those lines, an "off-the-shelf" package substrate 441 be used with any one or more dies, where a pitch 402 and/or a multiple of pitch 402 of conductive via structures 418 is used by such one or more dies for interconnection with package substrate 441. Additionally, having a more complete distribution of conductive via structures 418 may improve manufacturability and may provide more uniform surfaces for coupling to. Additionally, package substrates 441 may be manufactured in bulk for sale to packaging houses or IC package manufacturers, and such vendors may effectively provide a custom or proprietary part with a commoditized package substrate 441. Moreover a sheet of package substrate 441 may be substantially larger than an interposer, and may be diced into a plurality of package substrates 441 for coupling to corresponding interposers and/or other one or more dies for dimensions selected by a user. Thus, a sheet of package substrate 441 may be used for a variety of configurations of IC packages. However, for purposes of clarity by way of example and not limitation, it shall be assumed that a middle section 442 is not used for conductive via structures 418 of package substrate 441, even though a package substrate 441 with conductive via structures 418 in such middle section 442 may be used as described below except that one or more such conductive via structures 418 in middle section 442 may be no-connects. Even though conductive via structures 418 may be at an angle which is not 90°, package substrate 441 may not have any lateral conductive via structures 418, namely generally less than at 45° degree angle.

FIGS. 5A and 5B are respective block diagrams of a cross sectional view depicting another exemplary flow for a package substrate 441 for an IC package 300 for a process of manufacturing thereof. Package substrate 441 may have a plurality of conductive via structures 418 extending from a lower surface 412 of package substrate 441 to an upper surface 411 of package substrate 441. Exposed ends 421 of via structures 418 may be further exposed by etching to expose upper portions 501 corresponding to ends 421 along upper surface 411. However, for package substrates 441 of FIGS. 4A and 5A, via structures 418, as well as exposed upper portions 501, may be formed by plating or other low-cost metallization. Thus, effectively via structures 418, with optional exposed upper portions 501, may be prefabricated as part of package substrates 441. Along those lines, by being able to use an inorganic package substrate 441, cost may be further reduced in comparison to using an organic package substrate 441.

Ends 421 and upper portions 501 may be for interconnecting to an interposer 340. Exposed ends 422 of via structures 418 along lower surface 412 may be for interconnecting to a printed circuit board or backplane or other circuit board.

At FIG. 5B, upper portions 501 may be used to provide raised interconnect structures 502, such as for example a Micro Pin Interconnect Layer ("µPLIR") as developed by Tessera of San Jose, Calif. Raised interconnect structures 502 may be formed with electroless and/or electrolytic plating of upper portions 501. Generally, a µPLIR platform utilizes conical-shaped raised interconnect structures 502, such as with solid copper contacts plated with nickel/copper for example. Along those lines, it should be understood that electroless nickel plating ("EN") for example is an autocatalytic deposition. Such µPLIR technology may be used for any of multiple types of interconnections, including for example IC-to-package substrate interconnections, interposer-to-package substrate interconnections, package-to-PCB interconnections, and/or PoP interconnections. Raised interconnect structures 502 may allow connections through a no underfill configuration. Additionally, as package substrate 441 may be a passive device formed of an inorganic material, rather than an underfill, an anisotropic conductive film ("ACF") may be used for interconnection to raised interconnect structures 502. Optionally, an underfill may be used with raised interconnect structures 502, as such raised features enhances flow through.

Solder bumps 401, such as for a plurality of raised interconnect structures 502 respectively, may be deposited for coupling to conductive via structures 418. Such solder bumps 401 may be deposited along upper surface 411 of package substrate 441 corresponding to exposed tops 521 of raised interconnect structures 502. Via structures may have a pitch 402 which is equivalent to or at least sufficiently close to pitch 342, such that there is a one-to-one correspondence between via structures 418 of package substrate 441 and via structures 18 of interposer 340.

FIGS. 6A-1, 6A-2, 6B, 6C, 6D-1, 6D-2, 6E, 6F-1, 6F-2, and 6G are block diagrams depicting respective cross sectional views for exemplary flows for processes of manufacturing an IC package 300 after interconnection of interposer 340 of FIG. 3D with package substrate 441 of FIGS. 4B and 5B, respectively. Along those lines, FIGS. 6A-1 and 6A-2 are block diagrams depicting respective cross sectional views of IC package 300 after interconnection of interposer 340 of FIG. 3D with package substrate 441 of FIGS. 4B and 5B, respectively. Such interconnection may be formed by reflow. However, solder need not be used. For example, metal-to-metal direct bonding, intermetallic or other metallurgical attachment, conductive epoxy, or ACF may be used. Generally, upper surface area of package substrate may be approximately that of lower surface area of interposer 340. In other words, by having a one-to-one correspondence between via structures 18 and 418, package substrate 441 need not have any RDL and may be formed substantially smaller in surface area than in the past. FIGS. 6A-1 and 6A-2 are further simultaneously described with additional reference to FIGS. 3A through 3D, 4A, 4B, 5A, and 5B.

Molding at FIG. 3D may be used to protect thin interposer 340 for a backside reveal as well as attachment to package substrate 441. However, once attached to interposer 340, package substrate 441 may act as a stiffener for interposer 340. Along those lines, to control warping, a bulk material used to provide one or more dielectric layers of package substrate 441 may have a coefficient of thermal expansion ("CTE") substantially similar or equal to that of a bulk material used to provide one or more dielectric layers of interposer 340. Examples of materials that may be used for package substrate 441 include silicon, glass, ceramic (e.g., aluminum oxide or silicon carbon), or composite material (e.g., carbon fiber, epoxy, or polyimide). For purposes of clarity and not limitation, it shall be assumed that package substrate 441 is a glass stiffener.

Interposer 340 may thus be coupled to an upper surface 411 of package substrate 441 through a plurality of interconnects, such as previously described. Because of a common pitch as between via structures 18 and 418, there may exist a one-to-one correspondence between a plurality of interconnects of package substrate 441 and a plurality of interconnects of interposer 340. It should be understood that package substrate 441 does not include any redistribution layer. More generally, package substrate 441 does not have a redistribution layer for interconnecting via structures 418 thereof to via structures 18 of interposer 340 to provide one-to-one correspondence between such via structures of such coupled platforms.

Via structures 418 have a thickness 601, and via structures 18 have a thickness 602. Thickness 601 may at least be an integer multiple greater than thickness 602 of FIG. 3D. Along those lines, via structures 418 may represent a shortest distance or propagation delay through thickness of package substrate 441. Thus, package substrate 441 may have a minimum signal path delay for each of via structures 418 with respect to propagation of signals through package substrate 441. Furthermore, by having a thicker conductor, conductivity may be enhanced through a lowering of resistance. Though via structures 418 may have a lower resistance than via structures 18, length of via structures 418 may be significantly longer than that of via structures 18. Accordingly, by having less propagation delay and resistance than for example a conventional package substrate with an RDL, package substrate 441 may enhance delivery of power and ground, as well as provide enhanced performance for input and output communication to a circuit board to which IC package 300 is subsequently attached.

Pitch 402, of FIGS. 4B and 5B, corresponds to pitch of interconnects therefor, such as raised interconnect structures 502 or ends 421 of via structures 418. Likewise, pitch 342 corresponds to pitch of interconnects therefor, such as lower portions 313 of via structures 18 for example. Pitches 342 and 402 may each be 0.6 mm or smaller pitches, and pitch 323 may be 0.45 mm or less, and for a finer pitch, pitch 323 may be 10 microns or smaller pitch. Along those lines, a ball grid array ("BGA") may be used for interconnection of interposer 340 via structures 18 and package substrate via structures 418. However, a BGA may add cost. In contrast, due to relatively large dimensions, using large sheet goods which may be plated to form package substrates 441 with plated via structures 418, as well as optionally plated raised interconnect structures 502, may be a lower cost alternative. Along those lines, at FIGS. 4A and 5A, a sheet of material for providing of package substrates 441 may be obtained. Openings may be formed in such sheet of material for via structures 418 of such package substrates 441. Such openings in such sheet of material may be plated all at once in volume using a plating solution and electrical anodic contacting one or both surfaces of such sheet of material. Such sheet of material may be diced at some later time to provide such a plurality of package substrates including package substrate 441.

For purposes of clarity and not limitation, subsequent processing of IC package 300 of FIG. 6A-1 is further described, as such description likewise applies to IC package 300 of FIG. 6A-2. FIG. 6B is the diagram of FIG. 6A-1 after an underfill layer 611 is added between interposer 340 and package substrate 441. FIG. 6C is the diagram of FIG. 6C after polishing, grinding or lapping off a top portion of molding 322 down to an upper surface 622 of IC dies 301 and 302.

FIG. 6D-1 is the diagram of FIG. 6C after attachment of balls 633, such as solder balls for example, to previously exposed ends 422 of via structures 418 along lower surface 412 of package substrate 441. FIG. 6D-2 is the diagram of FIG. 6C after coupling of balls 633, such as solder balls for example, to previously exposed ends 422 of via structures 418 along lower surface 412 of package substrate 441. A bond via array ("BVA") of wires 635, such as from Tessera, may be coupled between ends 422 and corresponding balls 633. Such BVA wires 635 may be encapsulated in an encapsulant or molding material layer 634 deposited on such lower surface 412, and ends or tips of such BVA wires 635 may be exposed for attachment of corresponding balls 633. BVA wires 635 may allow for more flexing for attachment of IC package 300 to a circuit board. Such flexibility may be used to compensate for CTE mismatch between an IC package 300, in particular package substrate 441, and a circuit board to which such IC package 300 is attached.

For purposes of clarity and not limitation, subsequent processing of IC package 300 of FIG. 6D-1 is further described with respect to singulation, and such description likewise applies to IC package 300 of FIG. 6D-2. FIG. 6E is the diagram of FIG. 6D-1 rotated 90 degrees, with dashed lines 644 indicating where IC packages 300 may be diced or otherwise singulated from a wafer or other sheet good.

FIG. 6F-1 is the diagram of FIG. 6D-1 after singulation. IC package 300 is attached to a circuit board 655. An underfill layer 656 may optionally be deposited between lower surface 412 of IC package 300 and an upper surface of circuit board 655.

FIG. 6F-2 is the diagram of FIG. 6D-2 after singulation. IC package 300 is attached to a circuit board 655. In this configuration, no optional underfill layer 656 need be used in order to promote flexibility to have IC package 300 more capable of flexing with circuit board 655.

Accordingly, for IC package 300 of either or both of FIGS. 6F-1 and 6F-2, via structures 18 and 418, interconnects between via structures 18 and 418 for coupling interposer 340 and package substrate 441, as well as interconnects for coupling package substrate 441 and circuit board 655, may all be exclusively for power, ground, and package-to-board input/output communication.

Figure 6G:
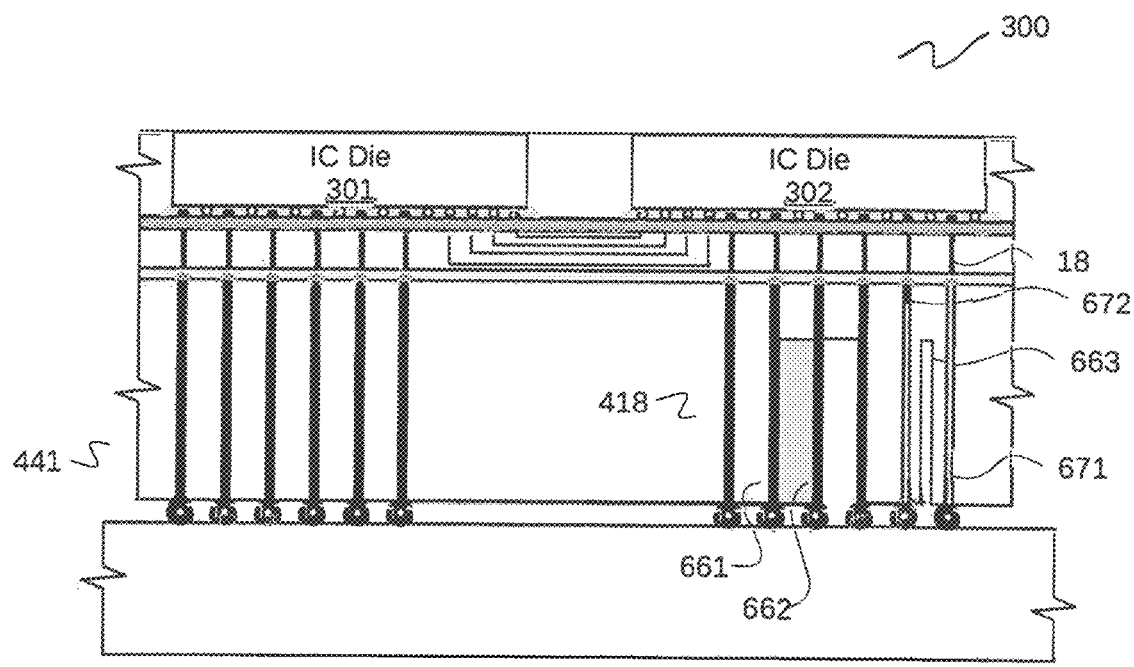

FIG. 6G is the diagram of FIG. 6F-1 without underfill layer 656 and with various optional configurations for package substrate 441. Because package substrate 441 may be substantially rigid, grooves or recesses 662 between adjacent via structures 418 may be formed. Such recesses 662 may be filled or not.

Along the above lines, a groove or recess 662 is formed between adjacent via structures 418 in package substrate 441. Recess 662 extends a full width between adjacent via structures 418, namely bordering each of such neighboring via structures 418. However, recess 662 extends only part of the way into or part of the thickness of package substrate 441. Recess 662 may be filled with a low modulus material 661, such as soft silicone or flexible epoxy resins for example. In another configuration of a groove or recess, namely recess 663, such recess does not border neighboring via structures 418, but rather some amount of material of package substrate 441 is disposed between each of such neighboring via structures 418 and recess 663.

Furthermore, via structures 418 need not be completely filled via structures. For example, via structure 671 is formed by conformal deposition along interior sidewalls of a hole, where such via hole may extend from upper to lower surface after such plating. For another example, via structure 672 is formed by conformal deposition along interior sidewalls of a hole, and then plating to seal an upper portion of such hole. Thus, bridging is not an issue, provided conductivity is provided from end-to-end of such via structures 671 and 672. Accordingly, both ends of holes of via structures 671 or 672 may be plugged, such as by plating using a wet chemistry with anodes at both ends for plating at both ends at the same time. Via structures 18, such as TSVs, may be substantially short in height, such as less than approximately 10 microns tall. So, current density of via structures in package substrate 441 is somewhat limited by such via structures 18.

Accordingly, undesirable package warpage may be avoided while reducing size of a package substrate ("footprint") and while reducing cost. Furthermore, conventional epoxy-based adhesive handle wafer materials need not be used, and a stiffener type material may be used. This allows for higher backside processing temperatures, such as for passivation for example, as an inorganic material may be used, and an expensive built-up layer by layer package substrate may be avoided as only direct through via structures 418 are used for conductivity through a package substrate 441. Moreover, shorter path lengths through a package substrate may improve interconnect reliability while reducing propagation delay. Passive devices may be coupled to package substrate 441 before plating, and such passive devices may be coupled by plating. Such passive devices may be formed, as thermal budget for an inorganic material used for package substrate may allow for formation of high quality passive devices. Additionally, package substrates may be formed in high-volume manufacturing of sheet goods, such as large-scale low cost plating and mass reflow. Because of a one-to-one correspondence between via structures 18 and 418, IC package assembly yield may be enhanced and such attachment may be with mass reflow assembly.

Additionally, even though an interposer 340 is illustratively depicted, in another implementation IC dies 301 and 302 may be directly coupled to package substrate 441 without the presence of an interposer 340, such as illustratively depicted in FIG. 7. FIG. 7 is generally the block diagram of FIG. 6F-2 without an interposer 340. In this configuration of IC package 300, package substrate 441 of FIG. 4C has IC dies 301 and 302 directly coupled to it without any RDL layer for coupling directly to package substrate 441. Microbumps 52 may have a pitch 402 or an integer multiple of pitch 402 of conductive via structures 418 of package substrate 441 for directly coupling IC dies 301 and 302 to corresponding via structures 418 of package substrate 441. Furthermore, IC dies 301 and 302 may be thicker than interposer 340, and so they may be less susceptible to warpage. Even though a single layer of IC dies 301 and 302 is illustratively depicted, either or both of IC dies 301 or 302 may be a die stack, such as optional one or more additional stacked dies 701 on IC die 301 for example. Additionally, alternating rows or columns of microbumps 52 may be used for interconnection with corresponding rows or columns of conductive via structures 418. Again, not all conductive via structures 418 of package substrate 441 need be used, as some may go unused, as illustratively depicted for example.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
    obtaining a package substrate having a first plurality of via structures extending from a lower surface of the package substrate to an upper surface of the package substrate;
    etching to expose upper ends of the first plurality of via structures to provide a layer of interconnect structures extending above the upper surface of the package substrate;
    obtaining a die having a second plurality of via structures extending to a lower surface of the die;
    positioning the lower surface of the die for facing the upper surface of the package substrate to provide an integrated circuit package;
    forming wires directly attached to lower ends of the first plurality of via structures along the lower surface of the package substrate to provide a bond via array;
    depositing a molding compound along the lower surface of the package substrate over the bond via array; and
    coupling the die and the package substrate to one another;
    wherein the package substrate does not include a redistribution layer.

2. The method according to claim 1, wherein the first plurality of via structures of the package substrate are respectively coupled to the second plurality of via structures of the die for a one-to-one correspondence between the first plurality of via structures and the second plurality of via structures.

3. The method according to claim 1, wherein the first plurality of via structures are directly coupled to the second plurality of via structures.

4. The method according to claim 3, wherein the first plurality of via structures are respectively directly coupled to the second plurality of via structures through a corresponding plurality of interconnects.

5. The method according to claim 1, wherein the obtaining of the package substrate comprises:
    obtaining a sheet of material for providing of the package substrate;
    forming openings in the sheet of material for the first plurality of via structures of the package substrate; and
    depositing conductive material in the openings in the sheet of material to provide conductors of the first plurality of via structures.

6. The method according to claim 5, wherein the package substrate is formed of an inorganic material.

7. The method according to claim 5, wherein the package substrate is formed of a material selected from a group consisting of silicon, glass, polymer, and composite.

8. A method, comprising:
- obtaining a package substrate having a first plurality of via structures extending from a lower surface of the package substrate to an upper surface of the package substrate;
- obtaining a die having a second plurality of via structures extending to a lower surface of the die;
- coupling the die and the package substrate to one another;
- wherein the lower surface of the die faces the upper surface of the package substrate in an integrated circuit package;
- wherein the package substrate does not include a redistribution layer; and
- etching to expose upper ends of the first plurality of via structures to provide a layer of interconnect structures extending above the upper surface of the package substrate.

9. The method according to claim 8, further comprising plating the upper ends of the layer of interconnect structures to provide conical-shaped raised ends.

10. The method according to claim 8, wherein the step of coupling comprises respectively coupling the first plurality of via structures of the package substrate to the second plurality of via structures of the die for a one-to-one correspondence between the first plurality of via structures and the second plurality of via structures.

11. The method according to claim 8, wherein the first plurality of via structures have a first pitch which is equal to a second pitch of the second plurality of via structures.

12. The method according to claim 11, wherein:
- the die includes the redistribution layer disposed along an upper surface of the die;
- the die is an interposer; and
- the redistribution layer of the interposer is coupled to the second plurality of via structures of the interposer.

13. The method according to claim 12, further comprising coupling a plurality of dies to the redistribution layer of the interposer with a plurality of interconnects.

14. A method, comprising:
- obtaining a package substrate having a first plurality of via structures extending from a lower surface of the package substrate to an upper surface of the package substrate;
- obtaining an interposer having a second plurality of via structures extending to a lower surface of the interposer;
- wherein the lower surface of the interposer faces the upper surface of the package substrate in an integrated circuit package;
- wherein the package substrate does not include a redistribution layer;
- coupling the interposer and the package substrate to one another;
- wherein the first plurality of via structures have a first pitch which is equal to a second pitch of the second plurality of via structures;
- coupling a plurality of dies to the upper surface of the interposer with a plurality of interconnects having
- a third pitch having a greater density than both the first pitch and the second pitch; and
- etching the package substrate to expose upper ends of the first plurality of via structures to provide a layer of micro pins extending above the upper surface of the package substrate.

* * * * *